(12) United States Patent
Nakajun et al.

(10) Patent No.: US 12,302,656 B2
(45) Date of Patent: May 13, 2025

(54) IMAGING DEVICE

(71) Applicant: Panasonic Intellectual Property Management Co., Ltd., Osaka (JP)

(72) Inventors: Akio Nakajun, Toyama (JP); Hideyuki Odahara, Kyoto (JP); Manabu Tsunoda, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 953 days.

(21) Appl. No.: 17/359,715

(22) Filed: Jun. 28, 2021

(65) Prior Publication Data

US 2021/0327935 A1 Oct. 21, 2021

Related U.S. Application Data

(63) Continuation of application No. PCT/JP2019/049112, filed on Dec. 16, 2019.

(30) Foreign Application Priority Data

Feb. 15, 2019 (JP) .................................. 2019-025142
Nov. 1, 2019 (JP) .................................. 2019-200141

(51) Int. Cl.
*H01L 23/02* (2006.01)
*H01L 27/146* (2006.01)
(Continued)

(52) U.S. Cl.
CPC ....... *H10F 39/804* (2025.01); *H10F 39/8053* (2025.01); *H10F 39/8057* (2025.01); *H10F 39/8063* (2025.01)

(58) Field of Classification Search
CPC ......... H01L 27/14618; H01L 27/14621; H01L 27/14623; H01L 27/14627;
(Continued)

(56) References Cited

U.S. PATENT DOCUMENTS 6,831,692 B1 12/2004 Oda
2001/0048064 A1* 12/2001 Kitani .................. H10F 39/804
257/E31.117
(Continued)

FOREIGN PATENT DOCUMENTS

JP 2000-125209 4/2000
JP 2001-345391 A 12/2001
(Continued)

OTHER PUBLICATIONS

English Translation of Chinese Search Report dated Sep. 20, 2023 for the related Chinese Patent Application No. 201980078665.5.
(Continued)

*Primary Examiner* — Omar F Mojaddedi
(74) *Attorney, Agent, or Firm* — Rimon P.C.

(57) ABSTRACT

An imaging device includes: a semiconductor substrate including a pixel region in which a plurality of pixels are arranged, and a peripheral region that surrounds the pixel region; a resin layer including a first side surface having a first curved surface, and a second side surface located away from the pixel region further than the first side surface, the resin layer being located on the peripheral region; a sealing layer which overlaps with the pixel region and the periphery region in a plan view, and seals the plurality of pixels; and a first light shielding layer which is located between the resin layer and the sealing layer, and overlaps with at least part of the first curved surface in the plan view.

19 Claims, 15 Drawing Sheets

(51) Int. Cl.
*H04N 25/00* (2023.01)
*H10F 39/00* (2025.01)

(58) Field of Classification Search
CPC ... H01L 27/14634; H01L 23/02; H04N 25/00; H10F 39/8053; H10F 39/8057; H10F 39/8063; H10F 39/809
See application file for complete search history.

(56) References Cited

U.S. PATENT DOCUMENTS

| | | | |
|---|---|---|---|
| 2004/0130640 A1 | 7/2004 | Fujimori | |
| 2009/0147115 A1* | 6/2009 | Tanida | H10F 39/804 348/294 |
| 2012/0211852 A1* | 8/2012 | Iwafuchi | H10F 39/8057 257/435 |
| 2013/0083493 A1* | 4/2013 | Kurihara | B23K 1/0016 361/809 |
| 2017/0338267 A1* | 11/2017 | Notsu | H10F 39/8063 |
| 2018/0259749 A1 | 9/2018 | Moriya et al. | |
| 2020/0066776 A1* | 2/2020 | Ootsuka | H10F 39/024 |
| 2020/0251499 A1* | 8/2020 | Wu | H01L 27/1259 |

FOREIGN PATENT DOCUMENTS

| | | |
|---|---|---|
| JP | 2004-207461 | 7/2004 |
| JP | 2008-186875 | 8/2008 |
| JP | 2012-033718 | 2/2012 |
| JP | 2012-186434 A | 9/2012 |
| JP | 2013-077701 | 4/2013 |
| JP | 2013-080825 | 5/2013 |
| JP | 2014-075480 | 4/2014 |
| JP | 2017-032798 | 2/2017 |
| JP | 2017-208468 | 11/2017 |

OTHER PUBLICATIONS

International Search Report of PCT application No. PCT/JP2019/049112 dated Feb. 25, 2020.

* cited by examiner

IMAGING DEVICE

BACKGROUND

1. Technical Field

The present disclosure relates to an imaging device that captures an image.

2. Description of the Related Art

For example, as disclosed in Japanese Unexamined Patent Application Publication Nos. 2012-33718, 2014-75480, and 2008-186875, an imaging device which captures an image has been known.

SUMMARY

In one general aspect, the techniques disclosed here feature an imaging device including: a semiconductor substrate including a pixel region in which a plurality of pixels are arranged, and a peripheral region that surrounds the pixel region; a resin layer including a first side surface having a first curved surface, and a second side surface located away from the pixel region further than the first side surface, the resin layer being located on the peripheral region; a sealing layer which overlaps with the pixel region and the periphery region in a plan view, and seals the plurality of pixels; and a first light shielding layer which is located between the resin layer and the sealing layer, and overlaps with at least part of the first curved surface in the plan view.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
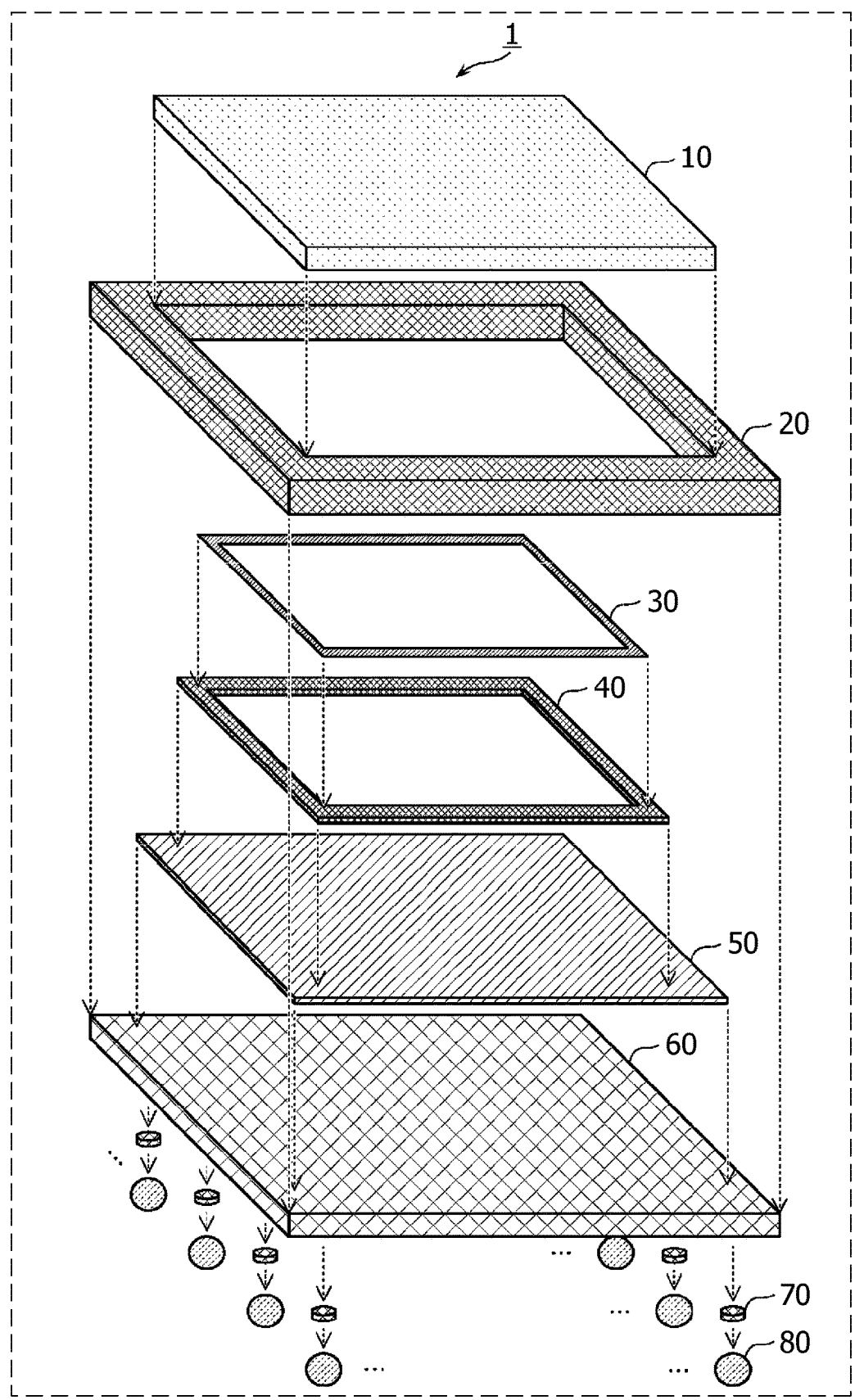
FIG. 1 is an exploded perspective view of an imaging device according to a first embodiment.

An imaging device according to an aspect of the present disclosure includes: a semiconductor substrate including a pixel region in which a plurality of pixels are arranged, and a peripheral region that surrounds the pixel region; a resin layer including a first side surface having a first curved surface, and a second side surface located away from the pixel region further than the first side surface, the resin layer being located on the peripheral region; a sealing layer which overlaps with the pixel region and the periphery region in a plan view, and seals the plurality of pixels; and a first light shielding layer which is located between the resin layer and the sealing layer, and overlaps with at least part of the first curved surface in the plan view.

With the imaging device in the above-described configuration, it is possible to reduce the occurrence of the following phenomenon: part of the light passing through the sealing layer is reflected by the first curved surface, and produces stray light which enters the pixel region. Therefore, with the imaging device in the above-described configuration, it is possible to reduce the occurrence of flare in a captured image.

The first light shielding layer may overlap with the entire first curved surface in a plan view.

Thus, it is possible to reduce the occurrence of flare in a captured image further effectively.

The first curved surface may be a concave surface which is concave to the inside of the resin layer.

Thus, when the first curved surface is a concave surface, it is possible to reduce the occurrence of flare in a captured image.

The second side surface may have a second curved surface. The imaging device may include a second light shielding layer which is located between the resin layer and the sealing layer, and overlaps with at least part of the second curved surface in a plan view.

Thus, it is possible to reduce the occurrence of flare in a captured image further effectively.

The second light shielding layer may overlap with the entire second curved surface in a plan view.

Thus, it is possible to reduce the occurrence of flare in a captured image further effectively.

The second curved surface may be a concave surface which is concave to the resin layer.

Thus, when the second curved surface is a concave surface, it is possible to reduce the occurrence of flare in a captured image.

The resin layer may have a first section which is in direct contact with the sealing layer.

Thus, the resin layer and the sealing layer can be brought into direct contact with each other.

The second side surface may have a second curved surface. The imaging device may include a second light shielding layer which is located between the resin layer and the sealing layer, and overlaps with at least part of the second curved surface in a plan view. The resin layer may have a first section which is located between the first curved surface and the second curved surface in a plan view, and is in direct contact with the sealing layer.

Thus, it is possible to further effectively reduce the occurrence of flare in a captured image while keeping the resin layer in direct with the sealing layer.

A plurality of pixels may include a first pixel including a first light receiving element, and a second pixel including a second light receiving element, and the size of the first light receiving element may be different from the size of the second light receiving element in a plan view.

Thus, when the plurality of pixels include the first pixel and the second pixel having light receiving elements in different sizes in a plan view, it is possible to reduce the occurrence of flare in a captured image.

The imaging device according to an aspect of the present disclosure may further include a mold which is in contact with the second side surface of the resin layer.

The width of the first light shielding layer may be greater than the height of the resin layer. The width of the first light shielding layer may be greater than twice the height of the resin layer. The sealing layer may be made of glass. The resin layer may have a second section which is in indirect contact with the sealing layer with the first light shielding layer interposed between the second section and the sealing layer. The first light shielding layer may include opaque resin. The difference between the refractive index of the resin layer and the refractive index of the mold may be smaller than the difference between the refractive index of the resin layer and the refractive index of air. The first light shielding layer may overlap with only part of the resin layer in a plan view. Each of the plurality of pixels may include a micro lens located between the sealing layer and the semiconductor substrate.

Hereinafter, a specific example of the imaging device according to an aspect of the present disclosure will be described with reference to the drawings. The embodiments shown here each indicate a specific example of the present disclosure. Thus, the numerical values, shapes, components, arrangement and connection manners of the components, steps (or processes), and order of the steps shown in the following embodiments are mere examples, and are not intended to limit the scope of the present disclosure. Of the components in the following embodiments, those components which are not described in the independent claim can be added optionally. It is to be noted that each of the drawings is a schematic diagram, and is not necessarily illustrated accurately.

First Embodiment

[1-1. Configuration of Imaging Device]

Hereinafter, the configuration of an imaging device according to a first embodiment will be described with reference to the drawings.

Figure 2:
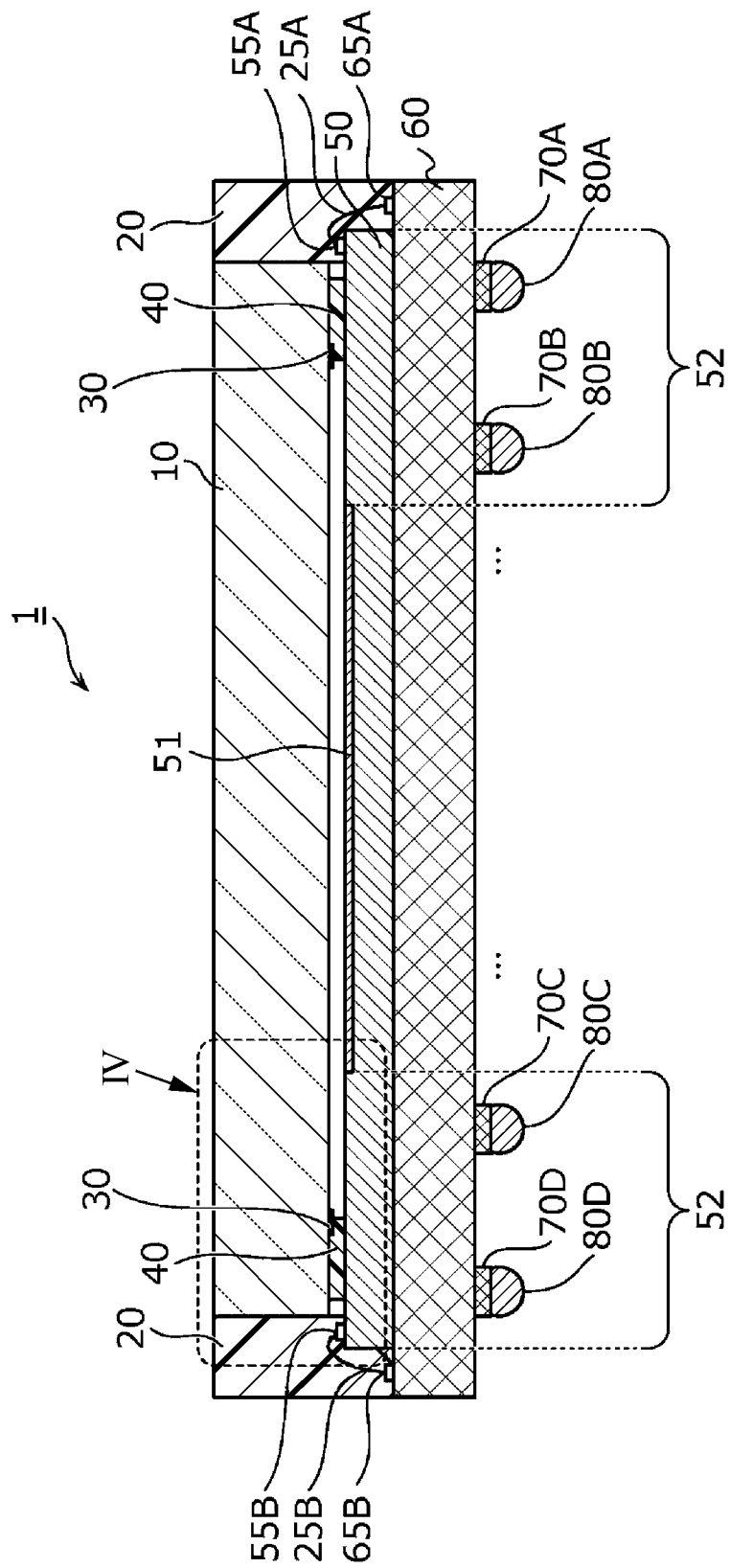
FIG. 2 is a cross-sectional view of the imaging device according to the first embodiment.

FIG. 1 is an exploded perspective view of an imaging device 1 according to the first embodiment, and FIG. 2 is a cross-sectional view of the imaging device 1.

As illustrated in FIG. 1, FIG. 2, the imaging device 1 includes a sealing layer 10, a mold 20, a first light shielding layer 30, a resin layer 40, a semiconductor substrate 50, a substrate 60, a plurality of solder resists 70, and a plurality of solder balls 80. Here, a solder resist 70A, a solder resist 70B, a solder resist 70C, and a solder resist 70D illustrated in FIG. 2 are each an example of a corresponding one of the plurality of solder resists 70 illustrated in FIG. 1. A solder ball 80A, a solder ball 80B, a solder ball 80C, and a solder ball 80D are each an example of a corresponding one of the plurality of solder balls 80 illustrated in FIG. 1.

In the semiconductor substrate 50, an integrated circuit is formed by microfabrication or the like. The integrated circuit constitutes an image sensor that captures an image, for example. Hereinafter, a description is given under the assumption that an image sensor is formed in the semiconductor substrate 50. The semiconductor substrate 50 has a pixel region 51 in which a plurality of pixels included in the image sensor are arranged, and a peripheral region 52 located around the pixel region 51.

The rear surface of the semiconductor substrate 50 is fixed to the surface of the substrate 60 by an adhesive agent, for example.

The resin layer 40 that bonds the semiconductor substrate 50 and the sealing layer 10 together is disposed on the surface of the semiconductor substrate 50. The resin layer 40 is comprised of, for example, an organic resin such as acrylic, polyimide, epoxy resin, however, is not necessarily comprised of those. Herein, the resin layer 40 is assumed be made of an epoxy resin.

The sealing layer 10 is a transparent substrate, and is bonded to the semiconductor substrate 50 by the resin layer 40. The sealing layer 10 is made of, for example, glass, however, is not necessarily made of glass. Herein, the sealing layer 10 is assumed to be glass.

The first light shielding layer 30 is disposed between the resin layer 40 and the sealing layer 10. The first light shielding layer 30 is made of, for example, metal such as titanium, copper, or a resin which is opaque, however, is not necessarily made of those. Herein, the first light shielding layer 30 is made of opaque resin bonded to the rear surface of the sealing layer 10.

The mold 20 is an opaque insulating resin which covers part on the surface of the substrate 60, part of the side surface and the surface of the semiconductor substrate 50, and the side surface of the sealing layer 10. The mold 20 is made of, for example, an organic resin such as acrylic, polyimide, epoxy resin, however, is not necessarily made of those. Herein, the mold 20 is assumed be made of an epoxy resin. The difference between the refractive indices of the resin layer 40 and the mold 20 is smaller than the difference between the refractive indices of the resin layer 40 and air. The mold 20 is disposed so as to surround the entirety of the semiconductor substrate 50 and the entirety of the sealing layer 10 in a plan view.

The plurality of solder balls 80 are disposed on the rear surface of the substrate 60. Each of the solder balls 80 is connected to the substrate 60 with a corresponding one of the solder resists 70 interposed therebetween. The solder balls 80 and the solder resists 70 are made of, for example, nickel, tin, copper, silver, gold, and metal containing these, however, is not necessarily made of those. Herein, the solder balls 80 and the solder resists 70 are assumed be made of metal containing nickel.

A plurality of metal wires made of copper, for example, are disposed on the surface of the semiconductor substrate 50. A plurality of metal wires made of copper, for example, are disposed on the surface of the substrate 60. The plurality of metal wires on the surface of the semiconductor substrate 50 and the plurality of metal wires on the surface of the substrate 60 are coupled by a plurality of bonding wires made of gold, for example. Herein, a metal wire 55A, a metal wire 55B illustrated in FIG. 2 are each an example of a corresponding one of the plurality of metal wires on the surface of the semiconductor substrate 50. A metal wire 65A, a metal wire 65B illustrated in FIG. 2 are each an example of a corresponding one of the plurality of metal wires on the surface of the substrate 60. A bonding wire 25A, a bonding wire 25B illustrated in FIG. 2 are each an example of a corresponding one of the plurality of bonding wires that couple the plurality of metal wires on the surface of the semiconductor substrate 50 to the plurality of metal wires on the surface of the substrate 60.

Figure 3:
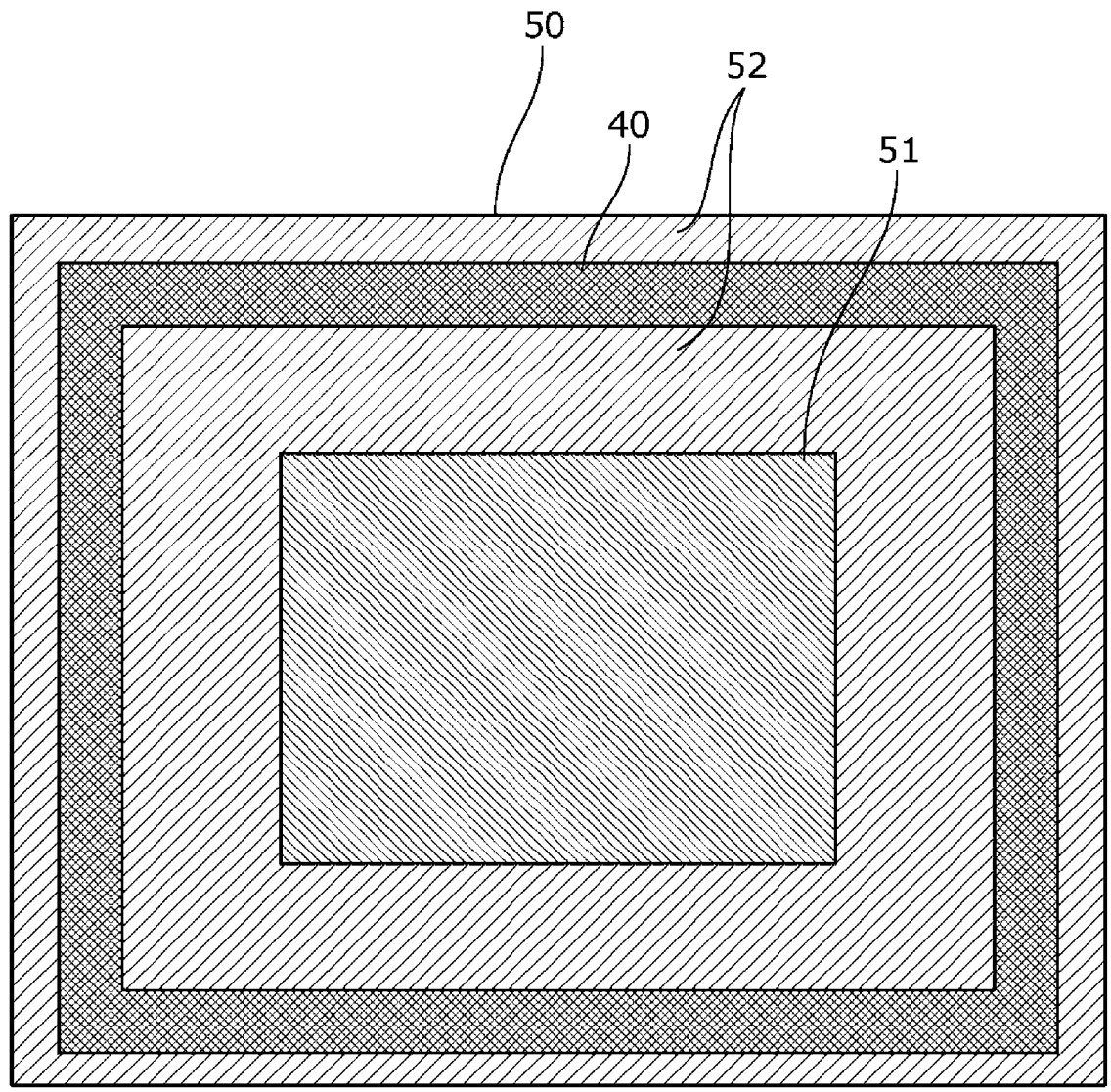
FIG. 3 is a plan view illustrating a positional relationship between a semiconductor substrate and a resin layer according to the first embodiment.

FIG. 3 is a plan view illustrating a positional relationship between the semiconductor substrate 50 and the resin layer 40.

As illustrated in FIG. 3, the resin layer 40 is disposed on the peripheral region 52 so as to surround the entirety of the pixel region 51 in a plan view. Herein, the "plan view" refers to viewing in a direction perpendicular to the major surface of the semiconductor substrate 50.

Figure 4:
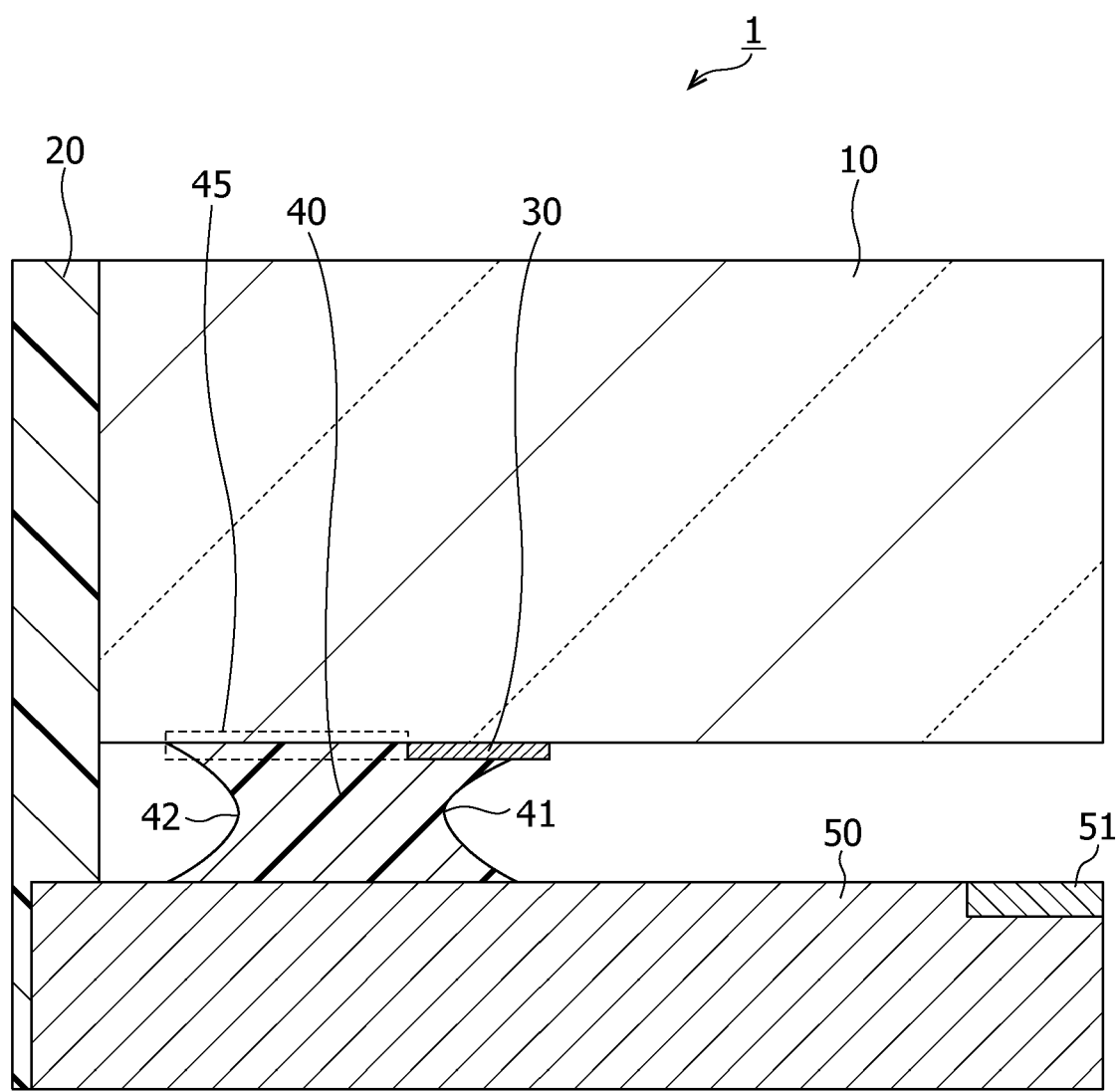
FIG. 4 is an enlarged cross-sectional view of the imaging device according to the first embodiment.

FIG. 4 is an enlarged view of an area IV in FIG. 2.

As illustrated in FIG. 4, the resin layer 40 has a first side surface 41 near the pixel region 51 and a second side surface 42 near the peripheral region 52. The first side surface 41 and the second side surface 42 are each a curved surface. Thus, the first side surface 41 may be referred as a first curved surface, and the second side surface 42 may be referred as a second curved surface. The first curved surface and the second curved surface may be each a concave surface which is concave to the inside of the resin layer 40, for example, may be a convex surface which projects to the outside of the resin layer 40, or may be a convex and concave surface. Alternatively, the first curved surface 41 or the second curved surface 42 may include a surface which is convex or concave on part of the side surface. Herein, the first curved surface and the second curved surface are each a concave surface which is concave to the inside of the resin layer 40.

The first light shielding layer 30 covers at least part of the first side surface 41 in a plan view. Thus, the first light shielding layer 30 reduces the incidence of light passing through the sealing layer 10 to the first side surface 41. From the point of view of reducing the incidence of light passing through the sealing layer 10 to the first side surface 41, the first light shielding layer 30 may have light shielding property. However, the first light shielding layer 30 does not necessarily have light shielding property as long as at least the incidence of light can be reduced. Alternatively, from the above-mentioned point of view, the first light shielding layer 30 may cover the entire first side surface 41 in a plan view. However, as long as the first light shielding layer 30 covers at least part of the first side surface 41, it is not necessary to cover the entire first side surface 41. Herein, the first light shielding layer 30 is assumed to cover the entire first side surface 41 in a plan view. As long as the first light shielding layer 30 covers at least part of the first side surface 41, it is not necessary to cover the entire resin layer 40. Here, it is assumed that the first light shielding layer 30 covers only part of the resin layer 40 and does not cover the entire resin layer 40 in a plan view, in other words, the resin layer 40 has a first section 45 which is in direct contact with the sealing layer 10. The resin layer 40 has the first section 45, thereby improving the adhesion between the resin layer 40 and the sealing layer 10.

A plurality of pixels are disposed on the pixel region 51. The plurality of pixels include a first pixel and a second pixel having light receiving elements in different sizes in a plan view. The area of the first pixel may be greater than the area of the second pixel in a plan view.

Figure 5:
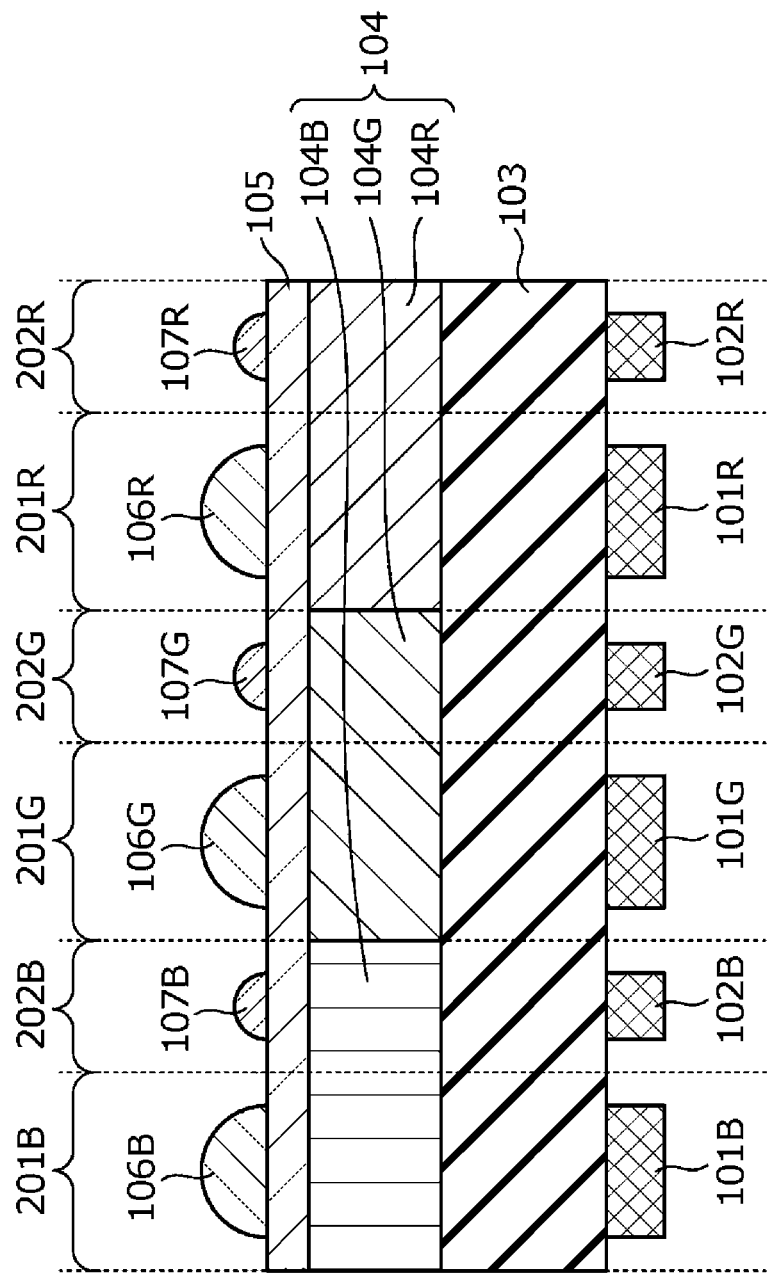
FIG. 5 is an enlarged cross-sectional view of a pixel region according to the first embodiment.

FIG. 5 is an enlarged cross-sectional view of the pixel region 51.

As illustrated in FIG. 5, the plurality of pixels disposed on the pixel region 51 include a plurality of first pixels 201R, a plurality of first pixels 201G, a plurality of first pixels 201B, a plurality of second pixels 202R, a plurality of second pixels 202G, and a plurality of second pixels 202B.

Each first pixel 201R includes a first light receiving element 101R, an insulating layer 103, a first-colored color filter 104R, a protective film 105, and a first micro lens 106R.

Each first pixel 201G includes a first light receiving element 101G, the insulating layer 103, a second-colored color filter 104G, the protective film 105, and a first micro lens 106G.

Each first pixel 201B includes a first light receiving element 101B, the insulating layer 103, a third-colored color filter 104B, the protective film 105, and a first micro lens 106B.

Each second pixel 202R includes a second light receiving element 102R, the insulating layer 103, the first-colored color filter 104R, the protective film 105, and a second micro lens 107R.

Each second pixel 202G includes a second light receiving element 102G, the insulating layer 103, the second-colored color filter 104G, the protective film 105, and a second micro lens 107G.

Each second pixel 202B includes a second light receiving element 102B, the insulating layer 103, the third-colored color filter 104B, the protective film 105, and a second micro lens 107B.

The first light receiving elements 101R, 101G, 101B and the second light receiving elements 102R, 102G, 102B each convert received light to an electrical signal. The first light receiving elements 101R, 101G, 101B and the second light receiving elements 102R, 102G, 102B are comprised of, for example, a silicon photodiode, an organic thin film photodiode, however, are not necessarily comprised of those. Here, the first light receiving elements 101R, 101G, 101B and the second light receiving elements 102R, 102G, 102B are each assumed to be a silicon photodiode. The organic thin film photodiode is formed by interposing, for example, an organic thin film which performs photoelectric conversion, by two electrodes.

The first light receiving elements 101R, 101G, 101B and the second light receiving elements 102R, 102G, 102B have different sizes in a plan view. More specifically, the first light receiving elements 101R, 101G, 101B are greater than the second light receiving elements 102R, 102G, 102B. For example, when the first light receiving elements 101R, 101G, 101B and the second light receiving elements 102R, 102G, 102B are both organic thin film photodiodes, the area of a pixel electrode divided for each pixel of the first light receiving elements 101R, 101G, 101B is greater than that of the second light receiving elements 102R, 102G, 102B.

The insulating layer 103 is a transparent insulating layer. The insulating layer 103 covers the plurality of first light receiving elements 101R, 101G, 101B, and the plurality of second light receiving elements 102R, 102G, 102B. The insulating layer 103 is a common insulating layer between the first pixel 201R, the first pixel 201G, the first pixel 201B, the second pixel 202R, the second pixel 202G and the second pixel 202B. The insulating layer 103 may be a common insulating layer between all pixels. The insulating layer 103 may include a wire which is not illustrated.

The first-colored color filter 104R, the second-colored color filter 104G, and the third-colored color filter 104B are each a filter that allows only predetermined color light to pass through. For example, the first-colored color filter 104R allows only red light to pass through. For example, the second-colored color filter 104G allows only green light to pass through. For example, the third-colored color filter 104B allows only blue light to pass through. The first-colored color filter 104R, the second-colored color filter 104G, and the third-colored color filter 104B are disposed on the upper surface of the insulating layer 103. The first-colored color filter 104R, the second-colored color filter 104G, and the third-colored color filter 104B each cover a first pair of light receiving elements consisting of one first light receiving element and one second light receiving element adjacent to each other. For example, the first-colored color filter 104R covers the first light receiving element 101R and the second light receiving element 102R. For example, the second-colored color filter 104G covers the first light receiving element 101G and the second light receiving element 102G. For example, the third-colored color filter 104B covers the first light receiving element 101B and the second light receiving element 102B.

Hereinafter, when a description may be given without explicitly distinguishing between the first-colored color filter 104R, the second-colored color filter 104G, and the third-colored color filter 104B, those may be simply referred to as the "color filter 104".

Each color filter 104 is a common color filter between the first pixel and the second pixel to be paired.

The protective film 105 is a transparent film. The protective film 105 covers a plurality of the first-colored color filters 104R, a plurality of the second-colored color filters 104G, and a plurality of the third-colored color filters 104B. The protective film 105 is a common protective film between the first pixel 201R, the first pixel 201G, the first pixel 201B, the second pixel 202R, the second pixel 202G, and the second pixel 202B. The protective film 105 may be a common protective film between all pixels.

A plurality of first micro lens 106R, 106G, 106B are associated with the plurality of first light receiving elements 101R, 101G, 101B, respectively, in one-to-one correspondence. The plurality of first micro lens 106R, 106G, 106B are disposed on the upper surface of the protective film 105.

A plurality of second micro lens 107R, 107G, 107B are associated with the plurality of second light receiving elements 102R, 102G, 102B, respectively, in one-to-one correspondence. The plurality of second micro lens 107R, 107G, 107B are disposed on the upper surface of the protective film 105.

[1-2. Method of Manufacturing Imaging Device]

FIGS. 6A to 6F are schematic views illustrating an example of a method of manufacturing the imaging device 1.

Figure 6A:
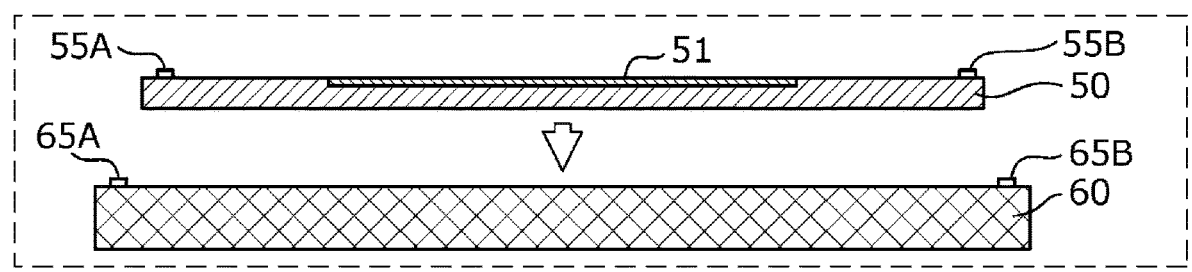
FIG. 6A is a schematic view illustrating an example step of a method of manufacturing the imaging device according to the first embodiment.
Figure 6B:
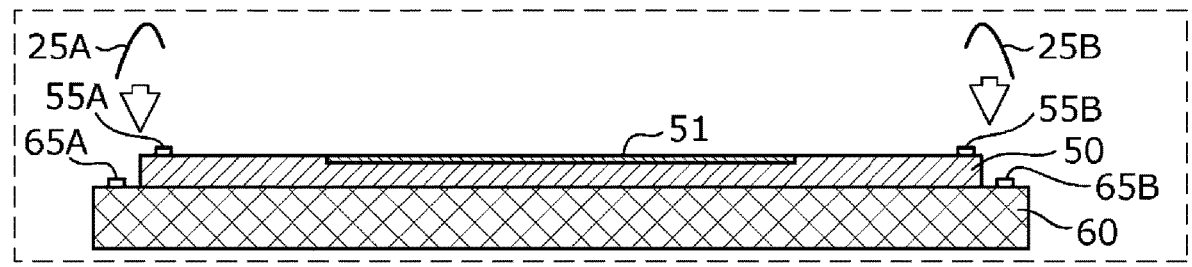
FIG. 6B is a schematic view illustrating an example step of the method of manufacturing the imaging device according to the first embodiment.
Figure 6C:
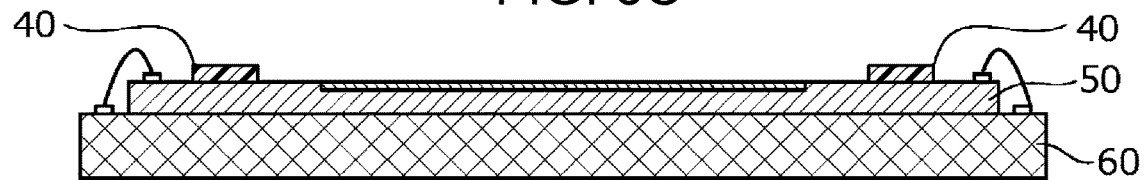
FIG. 6C is a schematic view illustrating an example step of the method of manufacturing the imaging device according to the first embodiment.
Figure 6D:
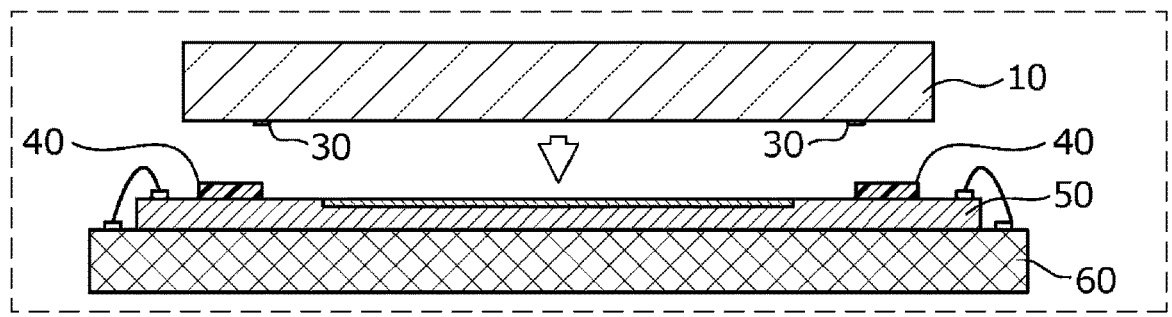
FIG. 6D is a schematic view illustrating an example step of the method of manufacturing the imaging device according to the first embodiment.
Figure 6E:
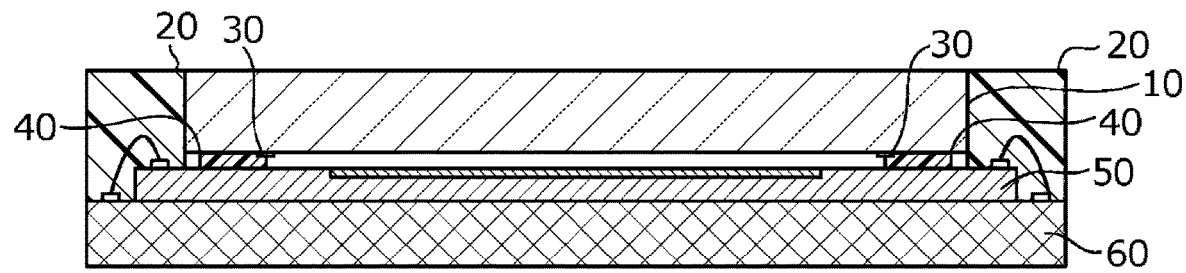
FIG. 6E is a schematic view illustrating an example step of the method of manufacturing the imaging device according to the first embodiment.
Figure 6F:
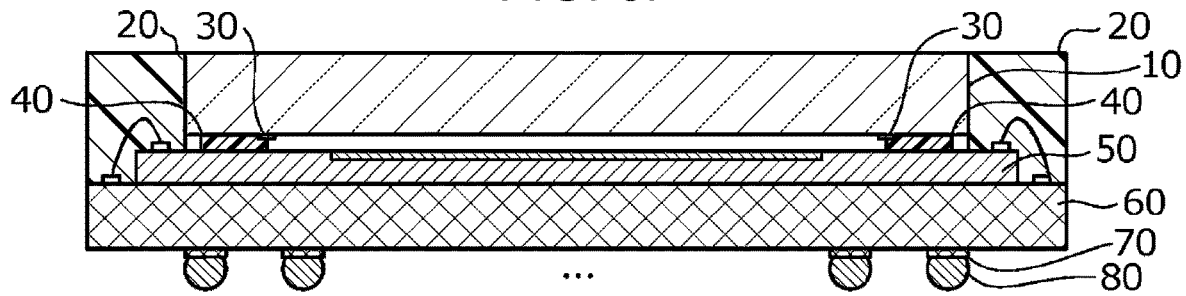
FIG. 6F is a schematic view illustrating an example step of the method of manufacturing the imaging device according to the first embodiment.

As illustrated in FIG. 6A, first, a manufacturing apparatus that manufactures the imaging device 1 fixes the semiconductor substrate 50 to a predetermined position on the surface of the substrate 60. An image sensor is formed in the semiconductor substrate 50. Next, as illustrated in FIG. 6B, the manufacturing apparatus couples the metal wires on the semiconductor substrate 50 to the metal wires on the substrate 60 by respective bonding wires. Here, the metal wires on the semiconductor substrate 50 are, for example, the metal wire 55A and the metal wire 55B in FIG. 6B. The metal wires on the substrate 60 are, for example, the metal wire 65A and the metal wire 65B in FIG. 6B. The bonding wires are, for example, the bonding wire 25A and the bonding wire 25B in FIG. 6B. Next, as illustrated in FIG. 6C, the manufacturing apparatus places the resin layer 40 at a predetermined position of the peripheral region 52 on the surface of the semiconductor substrate 50. Next, as illustrated in FIG. 6D, the manufacturing apparatus places the sealing layer 10 at a predetermined position on the resin layer 40, and bonds the semiconductor substrate 50 and the sealing layer 10 together with the resin layer 40 interposed therebetween. The first light shielding layer 30 is formed at a predetermined position on the rear surface of the sealing layer 10. The first light shielding layer 30 is formed by adhesion, for example. The semiconductor substrate 50 and the sealing layer 10 are bonded together by heat-curing the resin layer 40, for example. Next, as illustrated in FIG. 6E, the manufacturing apparatus covers part of the surface of substrate 60, part of the side surface and the surface of the semiconductor substrate 50, and the side surface of the sealing layer 10 by the mold 20. In this step, the manufacturing apparatus covers the metal wires on the semiconductor substrate 50, the bonding wires, and the metal wires 65 on the substrate 60 by the mold 20. Finally, as illustrated in FIG. 6F, the manufacturing apparatus couples the plurality of solder balls 80 to the rear surface of the substrate 60 with the plurality of solder resists 70 interposed therebetween.

[1-3. Discussion]

Figure 7:
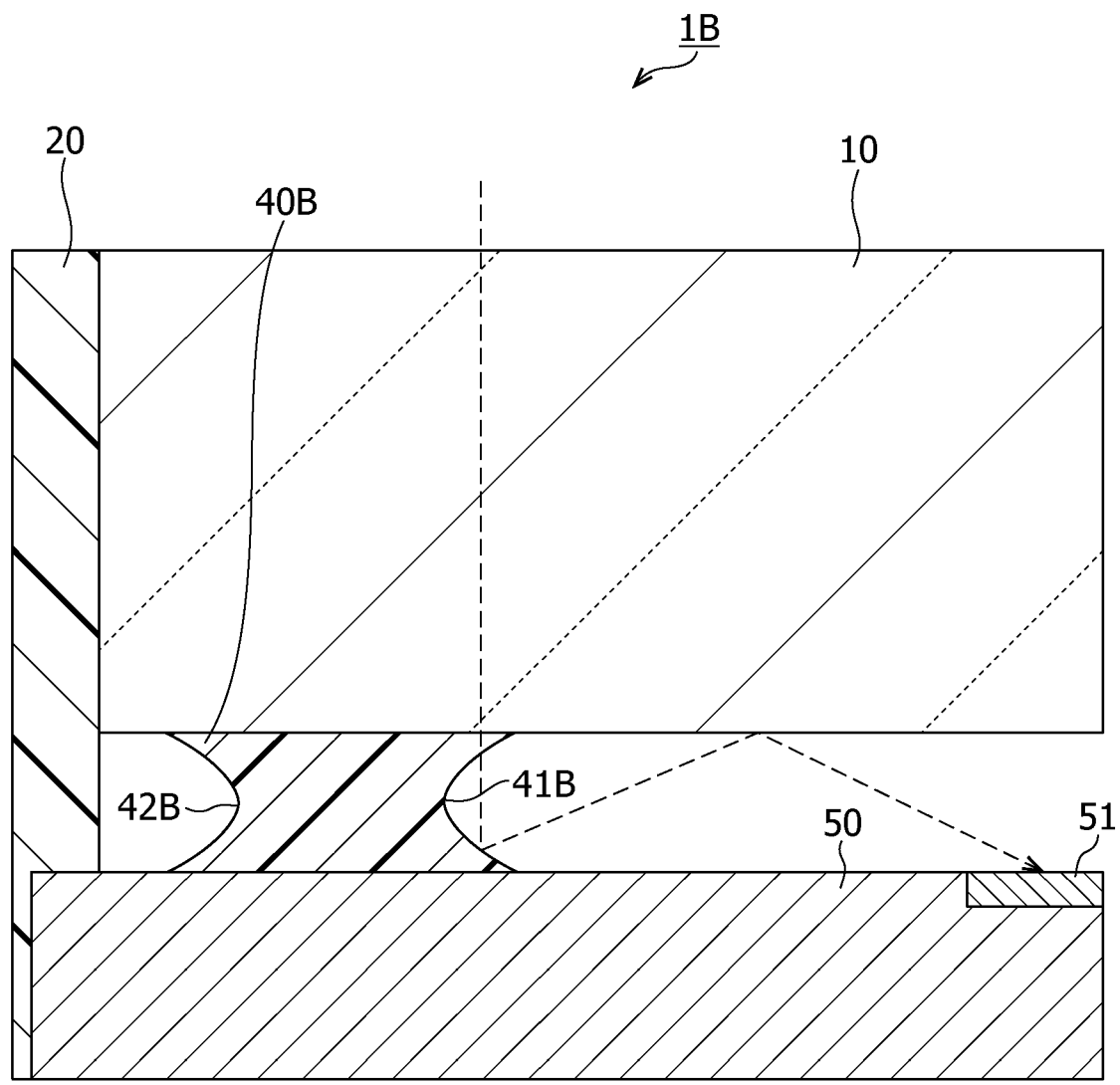
FIG. 7 is an enlarged cross-sectional view of an imaging device in related art.
Figure 8:
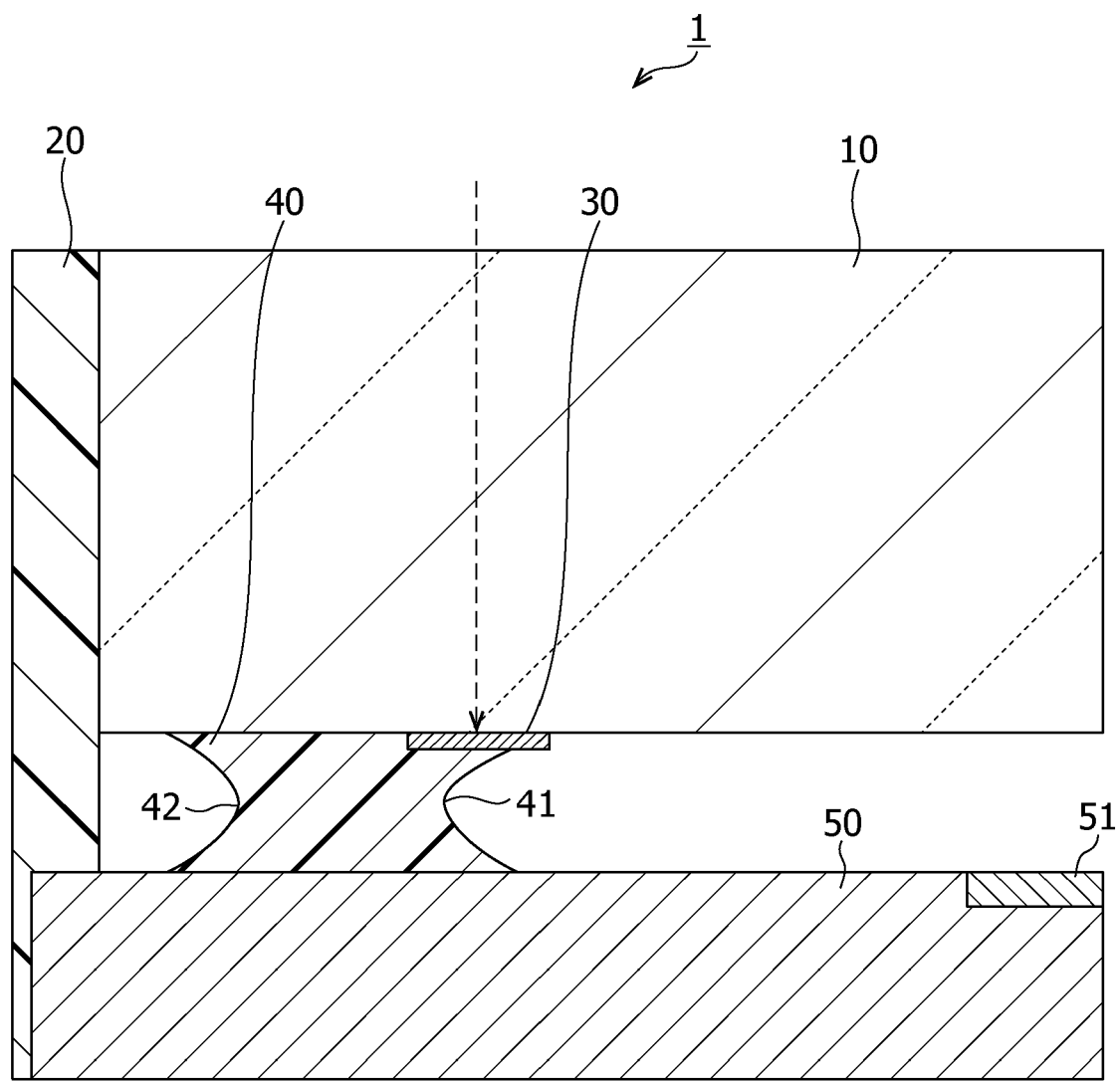
FIG. 8 is an enlarged cross-sectional view of the imaging device according to the first embodiment.

FIG. 7 is an enlarged cross-sectional view of an imaging device 1B which is a reference example of an imaging device, and FIG. 8 is an enlarged cross-sectional view of the imaging device 1 according to the first embodiment. The imaging device 1B as a reference example differs from the imaging device 1 according to the first embodiment in that the first light shielding layer 30 is not provided.

As illustrated in FIG. 7, the imaging device 1B is formed by removing the first light shielding layer 30 from the imaging device 1, and changing the resin layer 40 to a resin layer 40B. Here, like the resin layer 40, the resin layer 40B has a first side surface 41B near the pixel region 51 and a second side surface 42B near the peripheral region 52.

No light shielding layer is provided in the imaging device 1B. Therefore, as illustrated by a dotted line of FIG. 7, the light passing through the sealing layer 10 toward the first side surface 41B is not shielded or dimmed by a light shielding layer, and enters the first side surface 41B. Part of the light entering the first side surface 41B is reflected or refracted by the first curved surface in the first side surface 41B, and produces stray light which enters the pixel region 51. Part of the entering stray light is reflected, for example, by the rear surface of the sealing layer 10, and thus enters the pixel region 51. The stray light incident to the pixel region 51 causes flare occurs in an image captured by the imaging device 1B.

In contrast, in the imaging device 1, as illustrated by a dotted line of FIG. 8, the light passing through the sealing layer 10 toward the first side surface 41 is shielded or dimmed by the first light shielding layer 30 before entering the first side surface 41. Therefore, in the imaging device 1, as compared with the imaging device 1B in related art, the stray light to be incident to the pixel region 51 is reduced. Consequently, the imaging device 1 according to the first embodiment makes it possible to reduce the occurrence of flare in a captured image, as compared with the imaging device 1B in related art.

Figure 9:
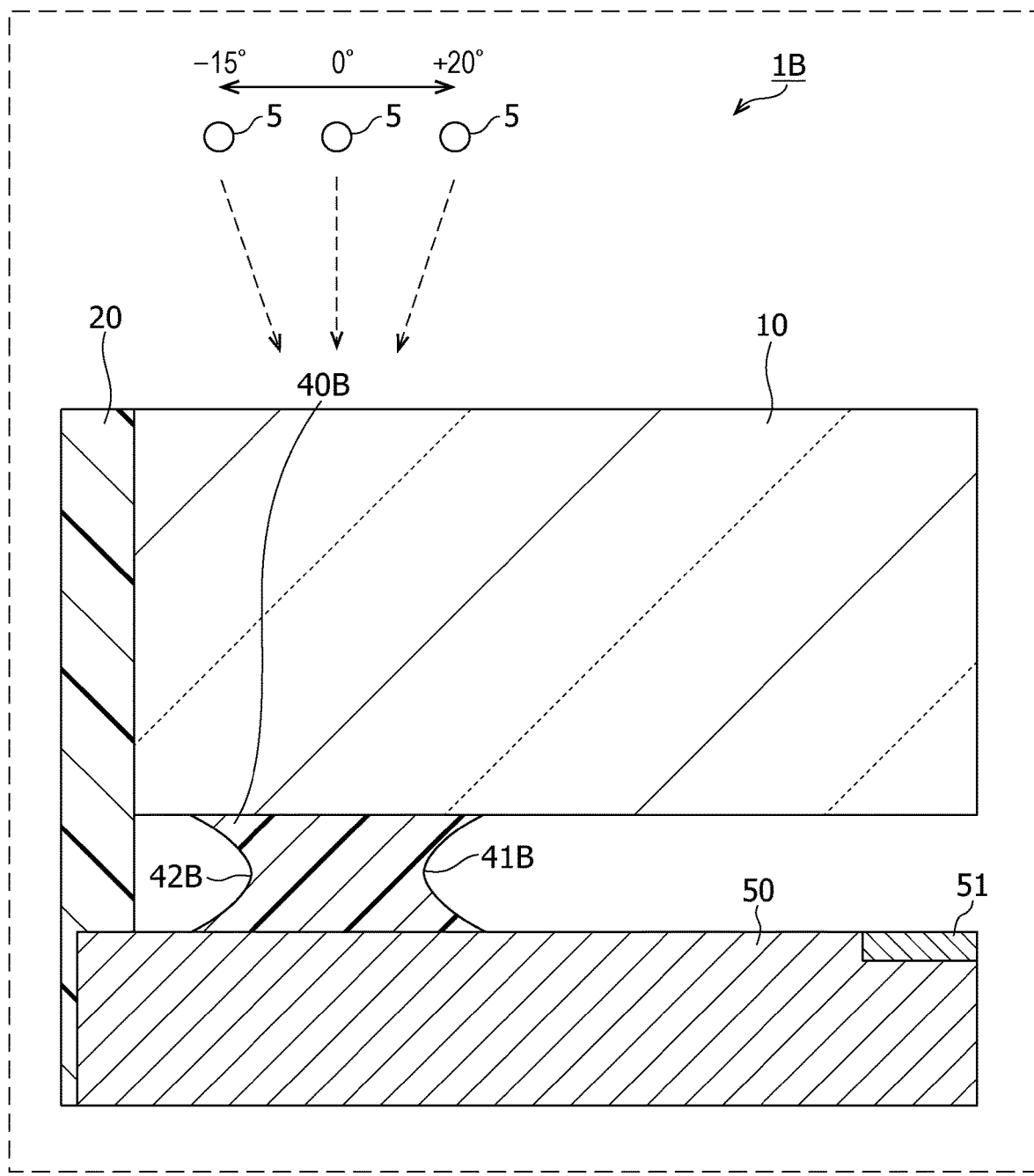
FIG. 9 is a schematic view illustrating the manner in which an optical simulation according to the first embodiment is performed.

FIG. 9 is a schematic view illustrating the manner in which an optical simulation is performed by the inventors.

As illustrated in FIG. 9, for the imaging device 1B, the inventors simulated the greatest intensity of stray light incident to the pixel region 51 when parallel rays of light to be incident to the resin layer 40B were changed. In the simulation, the position and the emission angle of a light source 5 which emits parallel rays of light were changed, and the parallel rays to be incident to the resin layer 40B are changed in a range from −15° to +20°, where rightward in FIG. 9 is assumed to indicate a positive direction. Although not illustrated, similarly for the imaging device 1, the inventors simulated the greatest intensity of stray light incident to the pixel region 51 when parallel rays of light to be incident to the resin layer 40 were changed in a range from −15° to +20°.

Table 1 is a result of the optical simulation described above, and shows the greatest intensity of stray light incident to the pixel region 51 for the imaging device 1B and the imaging device 1. Here, the greatest intensity is standardized such that when parallel rays of light enter the imaging device 1B, the greatest intensity of stray light incident to the pixel region 51 is assumed to be 1.

TABLE 1

|  | −15° | −10° | −5° | 0° | +5° | +10° | +15° | +20° |
|---|---|---|---|---|---|---|---|---|
| Imaging device 1B | 2.963 | 0.113 | 0.385 | 1.000 | 3.738 | 6.006 | 10.683 | 29.259 |
| Imaging device 1 | 1.211 | 0.015 | 0.007 | 0.002 | 0.064 | 0.150 | 1.382 | 3.209 |

As illustrated in Table 1, it is seen that in the imaging device 1 according to the first embodiment, as compared with the imaging device 1B in related art, the stray light to be incident to the pixel region 51 is reduced.

The inventors used the imaging device 1B and the imaging device 1 to cause the resin layer 40B or the resin layer 40 to be irradiated with light from a high brightness light source to capture an image.

Figure 10:
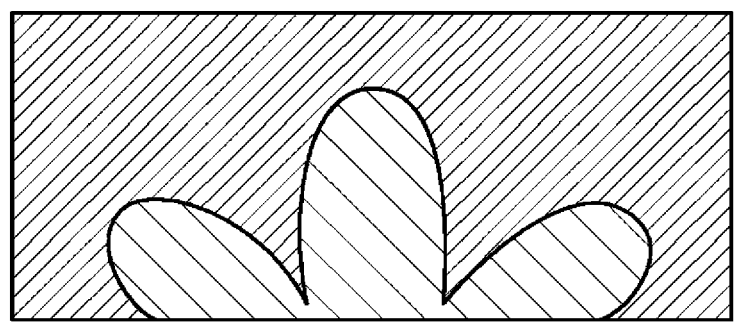
FIG. 10 is an image captured by an imaging device in related art.
Figure 11:
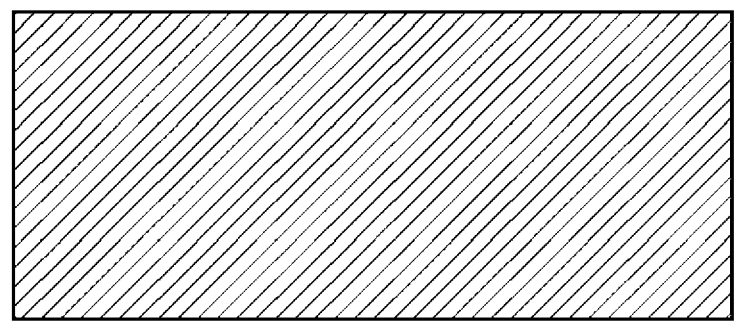
FIG. 11 is a schematic view of an image captured by the imaging device according to the first embodiment.

FIG. 10 is an image captured by the imaging device 1B. FIG. 11 is a schematic view of an image captured by the imaging device 1.

As illustrated in FIG. 10, FIG. 11, in the imaging device 1 according to the first embodiment, as compared with the imaging device 1B in related art, the occurrence of flare in a captured image is reduced.

Next, flare which occurs in an image captured by the imaging device 1B will be discussed.

As illustrated in FIG. 5, like the imaging device 1, in the imaging device 1B, the plurality of pixels disposed on the pixel region 51 include the first pixels 201R, 201G, 201B and the second pixels 202R, 202G, 202B having light receiving elements in different sizes in a plan view.

Figure 12:
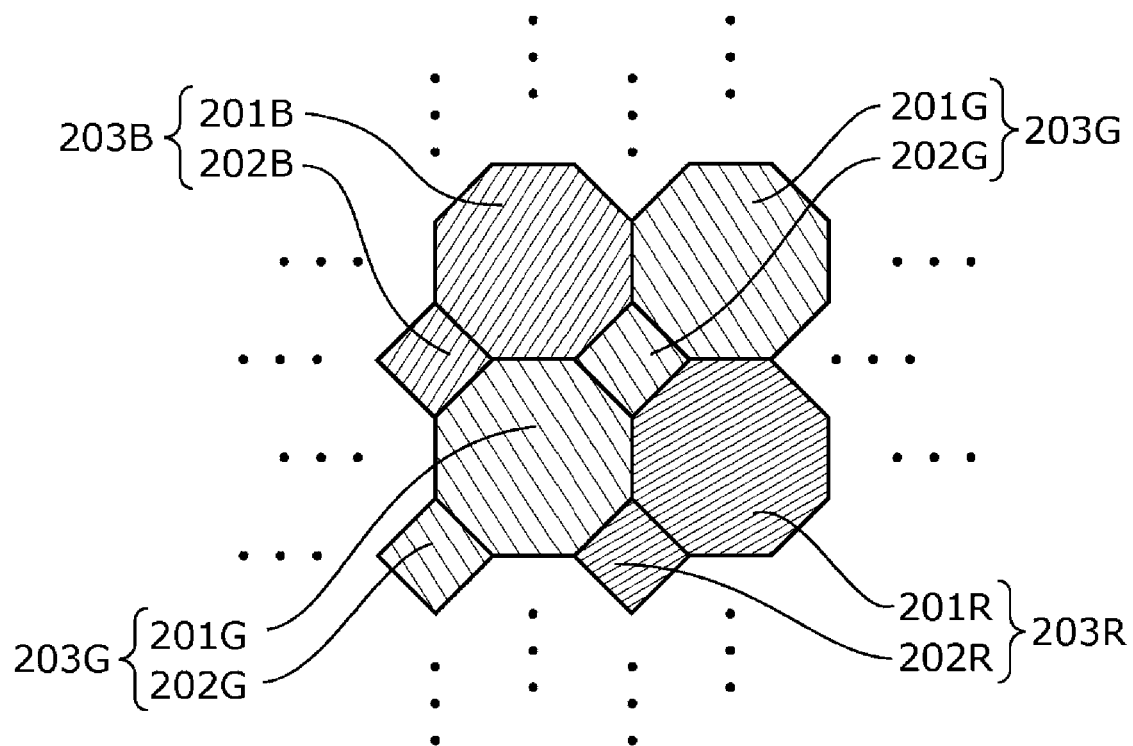
FIG. 12 is an enlarged plan view of the pixel region according to the first embodiment.

FIG. 12 is an enlarged plan view of the pixel region 51.

As illustrated in FIG. 12, the first pixels 201R, 201G, 201B are each regular octagonal in a plan view, for example, and the second pixels 202R, 202G, 202B are each square in a plan view, for example. When the first pixels 201R, 201G, 201B and the second pixels 202R, 202G, 202B with the color filter 104 of the same color disposed are collectively regarded as the pixels 203R, 203G, 203B, respectively, the pixels 203R, 203G, 203B are not point symmetric in a plan view. Depending on the incident angle of stray light, stray light which has passed through a color filter 104 of a color different from a desired color enters the first light receiving elements 101R, 10G, 101B or the second light receiving elements 102R, 102G, 102B. When the pixels 203R, 203G, 203B are not point symmetric, the wavelength sensitive to the first light receiving element 101R, 10G, 101B or second light receiving element 102R, 102G, 102B for incident stray light at a specific incident angle, may vary with the incident direction of stray light. For example, when the incident angle of stray light is 70 degrees in a certain plane, the pixels 203R, 203G, 203B have a sensitivity to blue. However, when the incident angle is −70 degrees, the pixels 203R, 203G, 203B may have a sensitivity to red. Due to such incidence of stray light, colored flare occurs in an image captured by the imaging device 1B.

As described above, in the imaging device 1, as compared with the imaging device 1B, the stray light itself to be incident to the pixel region 51 is reduced. Consequently, as compared with the imaging device 1B in related art, the imaging device 1 according to the first embodiment can reduce the occurrence of colored flare in a captured image.

As illustrated in FIG. 4, in the imaging device 1, the resin layer 40 has the first section 45. Thus, a manufacturer who manufactures the imaging device 1 can visually check the bonding state between the resin layer 40 and the sealing layer 10 by allowing light to enter from the outside of the sealing layer 10.

According to the knowledge of the inventors, the stress applied to the contact surface between the first light shielding layer 30 and the resin layer 40 may increase as S/L increases, where S is the area of the contact surface, and L is the peripheral length of the contact surface. Since the imaging device 1 has a configuration in which the resin layer 40 has the first section 45, as compared with an imaging device having a configuration in which the light shielding layer covers the entire resin layer 40 in a plan view, S/L is smaller, and the stress applied to the contact surface is lower. Therefore, in the imaging device 1, as compared with an imaging device having a configuration in which the light shielding layer covers the entire resin layer 40 in a plan view, it is possible to reduce the occurrence of separation of the light shielding layer from the resin layer 40.

Second Embodiment

[2-1. Configuration of Imaging Device]

Hereinafter, the configuration of an imaging device according to the second embodiment will be described, where the configuration is formed by changing part of the configuration of the imaging device 1 according to the first embodiment.

Hereinafter, for an imaging device 1A, the same component as in the imaging device 1 is assumed to be already described, and is labeled with the same symbol. Then, a detailed description is omitted, and the point of difference from the imaging device 1 will be mainly described.

Figure 13:
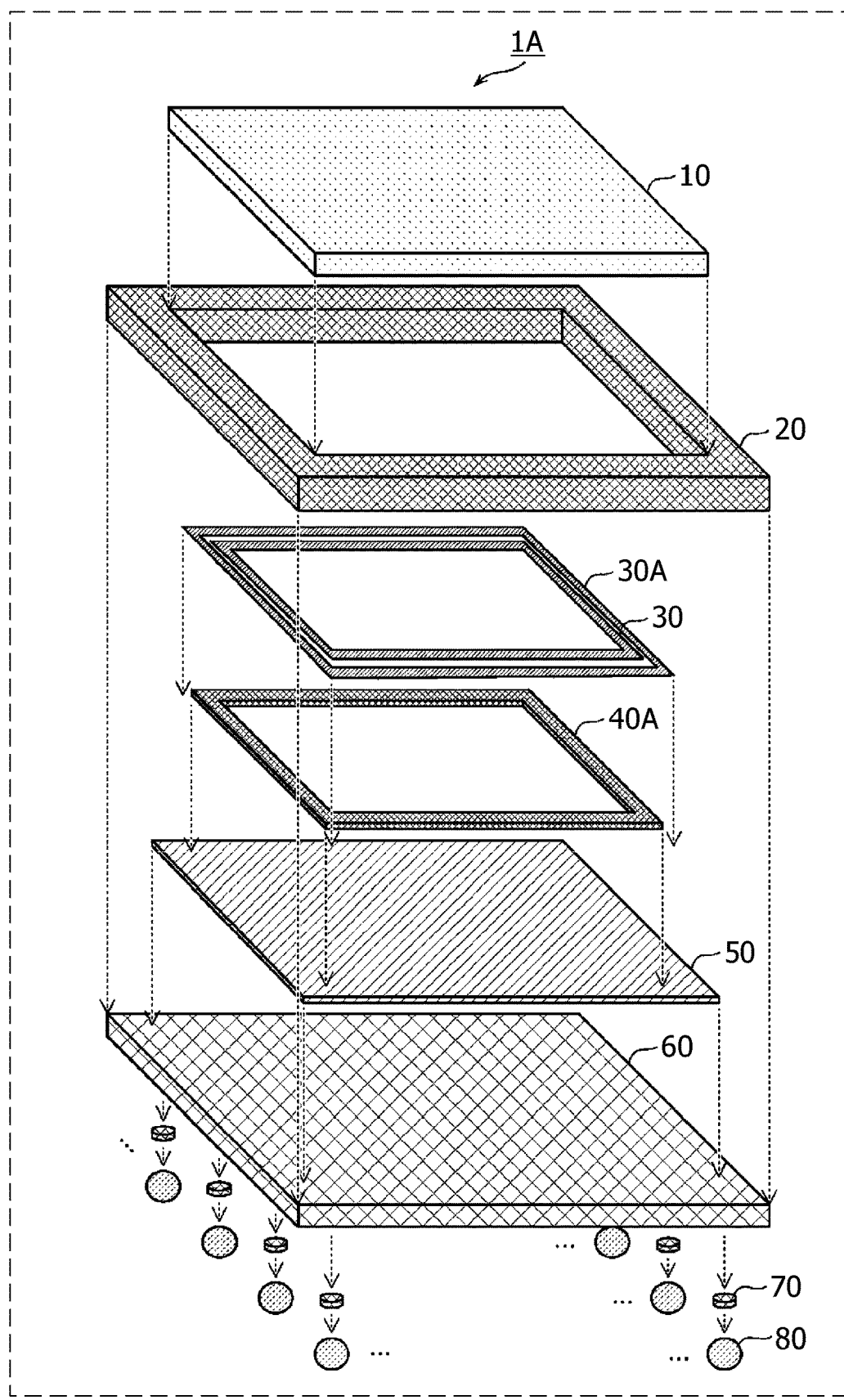
FIG. 13 is an exploded perspective view of an imaging device according to a second embodiment.
Figure 14:
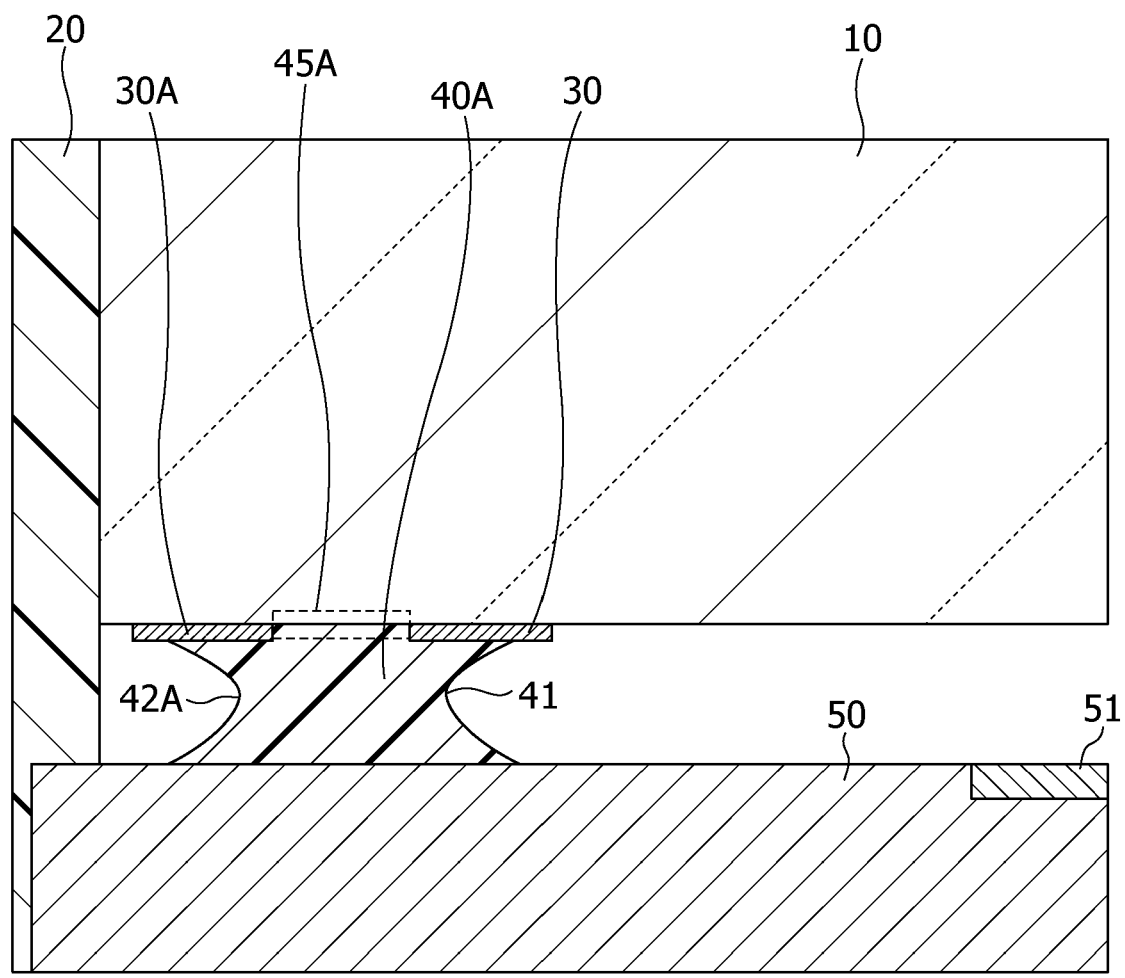
FIG. 14 is an enlarged cross-sectional view of the imaging device according to the second embodiment.

FIG. 13 is an exploded perspective view of the imaging device 1A according to the second embodiment, and FIG. 14 is an enlarged cross-sectional view of the imaging device 1A.

As illustrated in FIG. 13, FIG. 14, the imaging device 1A differs from the imaging device 1 according to the first embodiment in that a second light shielding layer 30A is added, and the resin layer 40 is changed to a resin layer 40A.

The resin layer 40A is changed from the resin layer 40 such that instead of the second side surface 42, a second side surface 42A is provided. Like the second curved surface in the second side surface 42, the second curved surface in the second side surface 42A may be a concave surface which is concave to the inside of the resin layer 40A, may be a convex surface which projects to the outside of the resin layer 40A, or may be a convex and concave surface. Herein, the second curved surface is assumed to be a concave surface which is concave to the inside of the resin layer 40A.

The second light shielding layer 30A is disposed between the resin layer 40A and the sealing layer 10. The second light shielding layer 30A covers at least part of the second side surface 42A in a plan view. Thus, the second light shielding layer 30A reduces the incidence of light to the second side surface 42A, the light having passed through the sealing layer 10. From the point of view of reducing the incidence of light passing through the sealing layer 10 to the second side surface 42A, the second light shielding layer 30A may have light shielding property. However, the second light shielding layer 30A does not necessarily have light shielding property as long as at least transmission of light can be reduced. Alternatively, from the above-mentioned point of view, the second light shielding layer 30A may cover the entire second side surface 42A in a plan view. However, as long as the second light shielding layer 30A covers at least part of the second side surface 42A, it is not necessary to cover the entire second side surface 42A. Herein, the first light shielding layer 30 is assumed to cover the entire first side surface 41 in a plan view. The material for the second light shielding layer 30A is the same as that of the first light shielding layer 30. Herein, like the first light shielding layer 30, the second light shielding layer 30A is made of opaque resin bonded to the rear surface of the sealing layer 10.

As long as the first light shielding layer 30 covers at least part of the first side surface 41, and the second light shielding layer 30A covers at least part of the second side surface 42A in a plan view, it is not necessary to cover the entire resin layer 40A by the first light shielding layer 30 and the second light shielding layer 30A together. Herein, it is assumed that the first light shielding layer 30 and the second light shielding layer 30A together cover only part of the resin layer 40A and do not cover the entire resin layer 40A in a plan view, in other words, the resin layer 40A has a first section 45A which is in direct contact with the sealing layer 10. The resin layer 40A has the first section 45A, thereby improving the adhesion between the resin layer 40A and the sealing layer 10.

[2-2. Discussion]

In contrast to the imaging device 1 according to the first embodiment, the imaging device 1A in the above-described configuration further includes the second light shielding layer 30A. Thus, in the imaging device 1A, the light passing through the sealing layer 10 toward the second side surface 42A is shielded or dimmed by the second light shielding layer 30A before entering the second side surface 42A. Thus, as compared with the imaging device 1, in the imaging device 1A, the occurrence of stray light due to reflection or refraction by the second side surface 42A is further reduced. Consequently, the imaging device 1A according to the second embodiment makes it possible to further reduce the occurrence of flare in a captured image, as compared with the imaging device 1 according to the first embodiment.

The inventors also performed for the imaging device 1A an optical simulation which is the same as the optical simulation according to the first embodiment.

Table 2 is a result of the optical simulation described above. Table 2 also lists the result of the optical simulation according to the first embodiment, shown in Table 1.

As illustrated in Table 2, it is seen that in the imaging device 1A according to the second embodiment, as compared with the imaging device 1 according to the first embodiment, stray light to be incident to the pixel region 51 is further reduced. Therefore, in the imaging device 1A according to the second embodiment, as compared with the imaging device 1 according to the first embodiment, the occurrence of flare in a captured image is further reduced.

TABLE 2

|  | −15° | −10° | −5° | 0° | +5° | +10° | +15° | +20° |
| --- | --- | --- | --- | --- | --- | --- | --- | --- |
| Imaging device 1B | 2.963 | 0.113 | 0.385 | 1.000 | 3.738 | 6.006 | 10.683 | 29.259 |
| Imaging device 1 | 1.211 | 0.015 | 0.007 | 0.002 | 0.064 | 0.150 | 1.382 | 3.209 |
| Imaging device 1A | 1.180 | 0.000 | 0.000 | 0.000 | 0.000 | 0.150 | 1.381 | 3.303 |

Modification

Hereinafter, the configuration of an imaging device 1C according to a modification will be described, where the configuration is formed by changing part of the configuration of the imaging device 1 according to the first embodiment.

Hereinafter, for the imaging device 1C according to a modification, the same component as in the imaging device 1 is assumed to be already described, and is labeled with the same symbol. Then, a detailed description is omitted, and the point of difference from the imaging device 1 will be mainly described.

Figure 15:
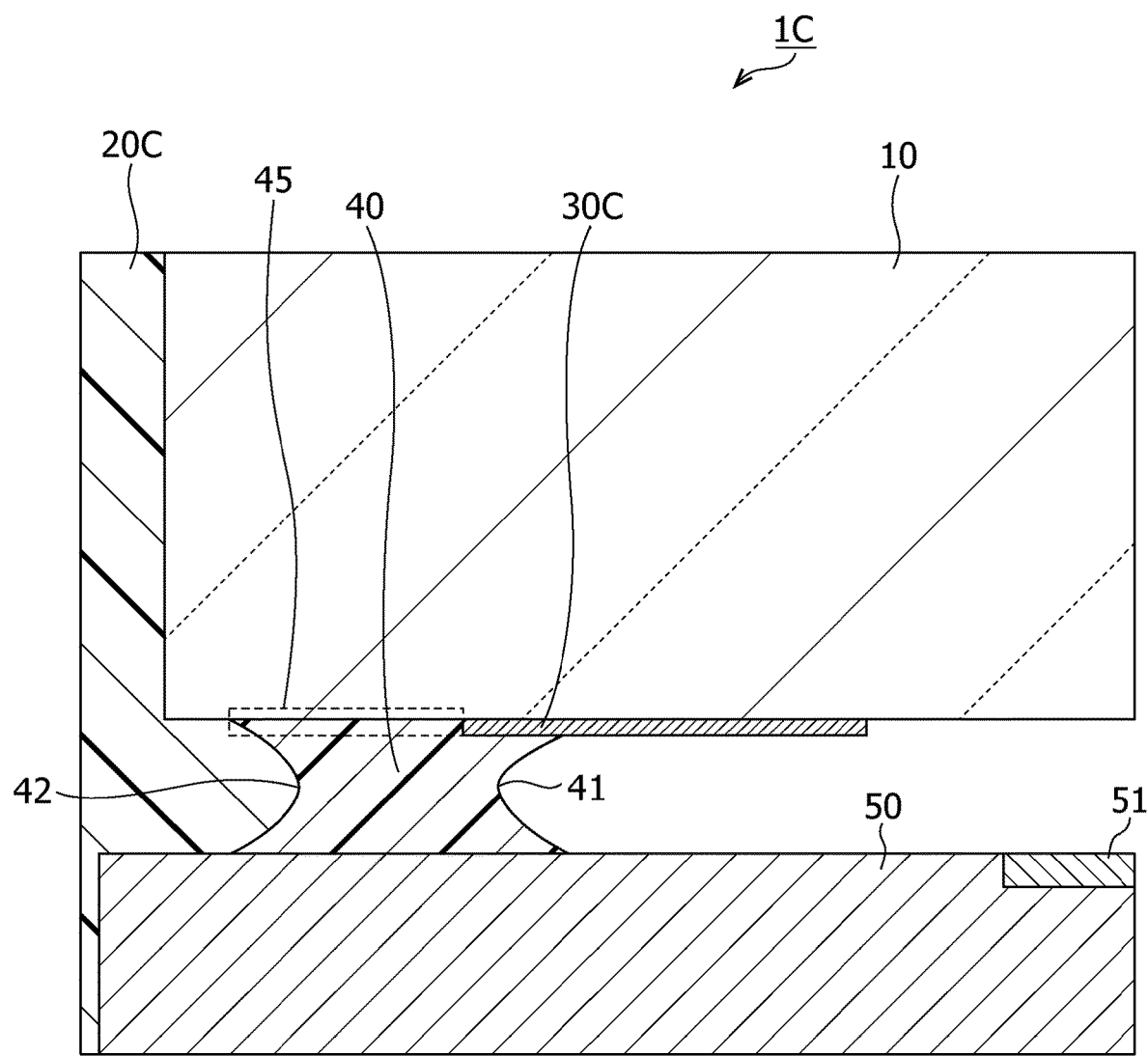
FIG. 15 is an enlarged cross-sectional view of an imaging device according to a modification.

FIG. 15 is an enlarged cross-sectional view of the imaging device 1C according to the modification.

As illustrated in FIG. 15, the imaging device 1C differs from the imaging device 1 according to the first embodiment in that the mold 20 is changed to a mold 20C, and the first light shielding layer 30 is changed to a first light shielding layer 30C.

The mold 20C is formed by changing the mold 20 to extend to a position to bring contact with the whole second side surface 42. The mold 20C is formed by curing a liquid organic resin by heat, for example. Therefore, no gap occurs between the mold 20C and the resin layer 40.

The difference between the refractive indices of the resin layer 40 and the mold 20C is smaller than the difference between the refractive indices of the resin layer 40 and air. Therefore, the imaging device 1C can further reduce the occurrence of flare in a captured image by the above-mentioned configuration.

The first light shielding layer 30C is changed from the first light shielding layer 30 to extend to a position where the width in a plan view is greater than the height of the resin layer 40. Thus, the imaging device 1C can further reduce the occurrence of flare in a captured image. The width of the first light shielding layer 30C may be greater than or equal to twice the height of the resin layer 40, for example. The width of the first light shielding layer 30C may be greater than or equal to three times the height of the resin layer 40, for example.

The imaging device 1C having the above-mentioned configuration is configured to shield or dim light to the first side surface 41 which is one of the two side surfaces of the resin layer 40: the first side surface 41 and the second side surface 42. The configuration of the imaging device 1C improves the adhesion between the resin layer 40 and the sealing layer 10, as compared with a configuration in which light to both the first side surface 41 and the second side surface 42 are shielded or dimmed, which are the two side surfaces of the resin layer 40.

The imaging device according to the present disclosure is widely applicable to a device that captures an image.

What is claimed is:

1. An imaging device comprising:
   a semiconductor substrate including a pixel region in which a plurality of pixels are arranged, and a peripheral region that surrounds the pixel region;
   a resin layer including a first side surface having a first curved surface, and a second side surface located away from the pixel region farther than the first side surface, the resin layer being located on the peripheral region of the semiconductor substrate;
   a sealing layer which overlaps with the pixel region and the periphery region in a plan view, and seals the plurality of pixels; and
   a first light shielding layer which is located between the resin layer and the sealing layer, and overlaps with at least part of the first curved surface of the resin layer in the plan view.

2. The imaging device according to claim 1, wherein the first light shielding layer overlaps with an entirety of the first curved surface in the plan view.

3. The imaging device according to claim 1, wherein the first curved surface is concave to an inside of the resin layer.

4. The imaging device according to claim 1, wherein the second side surface has a second curved surface, and the imaging device further comprises a second light shielding layer which is located between the resin layer and the sealing layer, and overlaps with at least part of the second curved surface in the plan view.

5. The imaging device according to claim 4, wherein the second light shielding layer overlaps with an entirety of the second curved surface in the plan view.

6. The imaging device according to claim 4, wherein the second curved surface is concave to an inside of the resin layer.

7. The imaging device according to claim 1, wherein the resin layer has a first section which is in direct contact with the sealing layer.

8. The imaging device according to claim 1, wherein the second side surface has a second curved surface, the imaging device further comprises a second light shielding layer which is located between the resin layer and the sealing layer, and overlaps with at least part of the second curved surface in the plan view, and the resin layer has a first section which is located between the first curved surface and the second curved surface in the plan view, and is in direct contact with the sealing layer.

9. The imaging device according to claim 1, wherein the plurality of pixels include a first pixel including a first light receiving element, and a second pixel including a second light receiving element, and a size of the first light receiving element is different from a size of the second light receiving element in the plan view.

10. The imaging device according to claim 1, further comprising
   a mold which is in contact with the second side surface of the resin layer.

11. The imaging device according to claim 10, wherein a width of the first light shielding layer is greater than a height of the resin layer.

12. The imaging device according to claim 10, wherein a width of the first light shielding layer is greater than twice a height of the resin layer.

13. The imaging device according to claim 1, wherein the sealing layer is made of glass.

14. The imaging device according to claim 1, wherein the resin layer has a second section in indirect contact with the sealing layer with the first light shielding layer disposed between the second section and the sealing layer.

15. The imaging device according to claim 1, wherein the first light shielding layer includes opaque resin.

16. The imaging device according to claim 10, wherein a difference between a refractive index of the resin layer and a refractive index of the mold is smaller than a difference between the refractive index of the resin layer and a refractive index of air.

17. The imaging device according to claim 1, wherein the first light shielding layer overlaps with only part of the resin layer in the plan view.

18. The imaging device according to claim 1, wherein the plurality of pixels each include a micro lens located between the sealing layer and the semiconductor substrate.

19. The imaging device according to claim 1, wherein the first light shielding layer overlaps with only a part of the resin layer in the plan view.

* * * * *